US010228394B2

(12) United States Patent
Montijo

(10) Patent No.: US 10,228,394 B2
(45) Date of Patent: Mar. 12, 2019

(54) MEASUREMENT SYSTEM THAT STORES PRE- AND POST-QUALIFICATION SIGNAL DATA

(71) Applicant: Keysight Technologies, Inc., Minneapolis, MN (US)

(72) Inventor: Allen Montijo, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 247 days.

(21) Appl. No.: 15/057,023

(22) Filed: Feb. 29, 2016

(65) Prior Publication Data

US 2017/0248634 A1  Aug. 31, 2017

(51) Int. Cl.
G01R 13/02 (2006.01)
G11C 7/10 (2006.01)
G11C 21/00 (2006.01)

(52) U.S. Cl.
CPC .......... *G01R 13/029* (2013.01); *G11C 7/1039* (2013.01); *G11C 21/00* (2013.01)

(58) Field of Classification Search
CPC ..................... G05B 19/045; G05B 2219/23289
See application file for complete search history.

(56) References Cited

U.S. PATENT DOCUMENTS

| | | | | |
|---|---|---|---|---|
| 4,198,683 A * | 4/1980 | Dagostino | ............ | G01R 13/345 711/160 |
| 4,802,098 A * | 1/1989 | Hansen | ................ | G01R 13/345 315/367 |
| 4,809,189 A * | 2/1989 | Batson | ................... | G01R 13/28 324/121 R |
| 5,530,454 A * | 6/1996 | Etheridge | .......... | G01R 13/0227 345/440.1 |
| 5,594,655 A * | 1/1997 | Berchin | ................ | G01R 13/345 324/76.24 |
| 6,892,150 B2 * | 5/2005 | Pickerd | .............. | G01R 13/0254 702/66 |
| 6,990,416 B2 | 1/2006 | Kobalka et al. | | |
| 7,265,700 B2 | 9/2007 | Johnstone et al. | | |
| 7,558,936 B2 | 7/2009 | Beale et al. | | |
| 7,809,991 B2 * | 10/2010 | Johnson | ................ | G06F 11/348 714/45 |
| 8,046,183 B2 | 10/2011 | Dobyns et al. | | |
| 9,410,989 B2 * | 8/2016 | Weller | ............... | G01R 13/0254 |
| 9,804,200 B2 * | 10/2017 | Timm | ................ | G01R 13/0272 |
| 9,874,587 B1 * | 1/2018 | Holcomb | ........... | G01R 13/0254 |
| 9,874,863 B2 * | 1/2018 | Barford | ................ | G05B 19/045 |

(Continued)

OTHER PUBLICATIONS

Zibin et al., "Design of WBDSO control circuit with state machine", Proceedings of the 2005 International Conference on Communications, Circuits and Systems, IEEE, May 27-30, 2005.

*Primary Examiner* — Jaehwan Oh

(57) ABSTRACT

A measurement system is provided that performs a qualified store algorithm. When performing the algorithm, the measurement system stores in memory digital data samples acquired during a time window while a qualification signal is valid, a preselected number of digital data samples acquired prior to and adjacent in time to the time window, and a preselected number of digital data samples acquired subsequent to and adjacent in time to the time window.

25 Claims, 4 Drawing Sheets

(56) References Cited

U.S. PATENT DOCUMENTS

| | | | | |
|---|---|---|---|---|
| 2004/0008160 | A1* | 1/2004 | Etheridge | G01R 13/0227 345/30 |
| 2005/0038615 | A1* | 2/2005 | Kobalka | G01R 13/32 702/69 |
| 2006/0156102 | A1* | 7/2006 | Johnson | G01R 31/3177 714/724 |
| 2006/0170452 | A1* | 8/2006 | Benavides | G06F 17/505 326/37 |
| 2006/0172783 | A1* | 8/2006 | Leung | H02M 3/33515 455/572 |
| 2007/0040657 | A1* | 2/2007 | Fosler | H02J 1/08 340/333 |
| 2008/0159368 | A1* | 7/2008 | Mende | G01R 1/06772 375/226 |
| 2011/0060540 | A1* | 3/2011 | Bartlett | G01R 13/0254 702/67 |
| 2011/0060541 | A1* | 3/2011 | Bartlett | G01R 13/0254 702/67 |
| 2014/0236539 | A1* | 8/2014 | Lehane | G06F 17/00 702/190 |
| 2015/0370234 | A1* | 12/2015 | Lehane | G01R 13/0272 326/46 |
| 2017/0060114 | A1* | 3/2017 | Barford | G05B 19/045 |

* cited by examiner

MEASUREMENT SYSTEM THAT STORES PRE- AND POST-QUALIFICATION SIGNAL DATA

BACKGROUND

In digital oscilloscopes, consecutively sampled values of an applied waveform are digitized, stored in a memory, and then used to reconstruct the waveform as a displayable image (the "trace") on a display device by reading and processing the stored values. The stored digital values are typically referred to as an acquisition record, the contents of which correspond to a definite time interval in the history of the applied waveform.

Many activities that are performed with an oscilloscope require that the displayed portion of the acquisition record be in some defined relationship to a detected event in the waveform, such as a rising or falling edge in the waveform, for example. The detected event is referred to as a trigger, or trigger event. When the event being detected is a condition of the waveform itself, the event is referred to as an internal trigger event. When the event being detected is a condition outside of the waveform that has some relationship to the waveform, such as another waveform, the event is referred to as an external trigger event. In response to a detected trigger event, some subset of the acquisition record is typically displayed to allow panning and zooming of the trace.

It is often desirable to capture data relative to multiple trigger events occurring in rapid succession, such as a set of successive radar pulses. This is often accomplished by using a mode of operations commonly referred to as "Segmented Memory Mode," in which the data acquisition memory is divided into blocks of N samples. The data acquired for each trigger event is stored in a separate block of N-sample memory. In this mode, all memory segments are of the same length. In some applications, the amount of data that needs to be captured varies from trace to trace, but because all of the memory segments are of the same size, the digital oscilloscope must be set to capture the longest event of interest. This can waste large amounts of acquisition memory, requiring the user to make a tradeoff between the number of events captured and the length of the longest event that is captured. For example, one type of radar system outputs long pulses spaced far apart in time when the target is a long distance away. As the target moves closer, the radar pulses become shorter and closer together. Because the segment size must be set to capture the longest event, acquisition memory is wasted on the shorter events, and therefore fewer events can be captured.

Another method used in digital oscilloscopes to capture these types of trigger events is commonly referred to as the qualified storage method. With this method, the oscilloscope performs an algorithm that allows the user to supply a "qualification" signal that specifies to the oscilloscope when to store and not store data to acquisition memory. Aside from the time during which the oscilloscope samples the waveform, data storage is started and stopped instantaneously. This mode makes very efficient use of acquisition memory, but does not provide extra data before and after the trigger event to account for data lost due to signal processing. High-bandwidth digital oscilloscopes use various signal processing operations to increase the accuracy of the data, e.g., filtering, which reduces the amount of data available for the actual measurement. If the user wants extra data to be available when using the qualified storage method, the user has to manipulate the qualification signal in order to force the storage of the extra data. Although manipulating the qualification signal to store extra data at the end of the trigger event is easy to do, it is difficult or impossible to do at the beginning of the event.

A need exists for a measurement system that is efficient in terms of acquisition memory utilization, that allows a preselected amount of extra data to be easily stored in acquisition memory when performing a qualified store algorithm, and that does not require the user to manipulate the qualification signal in order to force the storage of the extra data.

SUMMARY

The present embodiments are directed to a measurement system and method for use in the system for performing a qualified store algorithm. The measurement system comprises an analog-to-digital converter (ADC) configured to sample a time-varying waveform to create an acquisition record made up of acquired digital data samples, a memory, and a processor configured to perform the qualified store algorithm when the measurement system is in a qualified storage mode of operations. When the processor performs the qualified store algorithm, the processor stores in memory a number of digital data samples acquired during a time window while a qualification signal is valid, a preselected number of digital data samples acquired prior to and adjacent in time to the time window, and a preselected number of digital data samples acquired subsequent to and adjacent in time to the time window.

These and other features and advantages will become apparent from the following description, claims and drawings.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
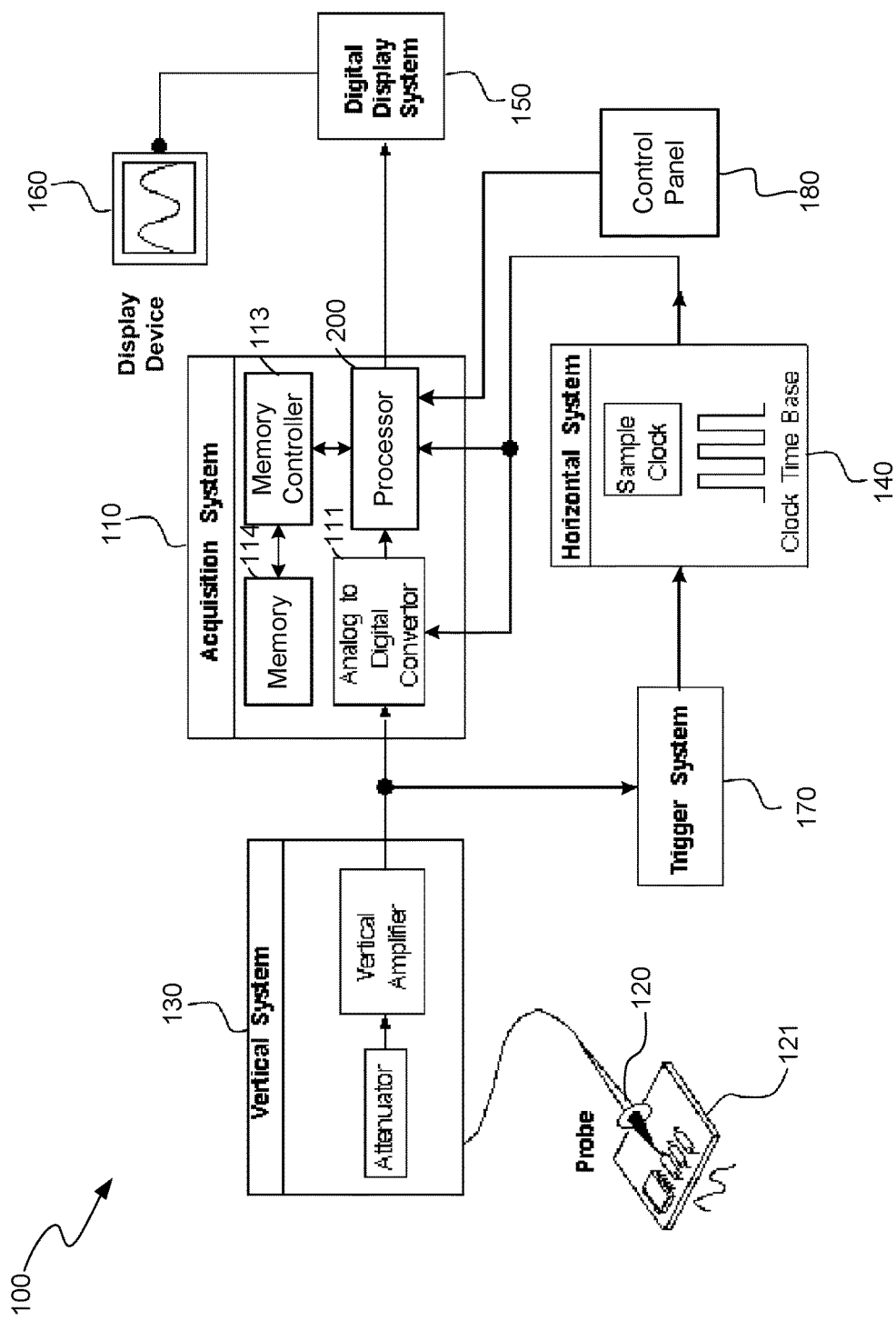
FIG. 1 illustrates a block diagram of portions of a measurement system having a data acquisition system in accordance with an embodiment configured to perform a qualified store algorithm that stores a preselected, programmable amount of data before a qualification signal becomes valid and after the qualification signal becomes invalid.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms "a," "an," and "the" include both singular and plural referents, unless the context clearly dictates otherwise. Thus, for example, "a device" includes one device and plural devices.

Relative terms may be used to describe the various elements' relationships to one another, as illustrated in the accompanying drawings. These relative terms are intended to encompass different orientations of the device and/or elements in addition to the orientation depicted in the drawings.

It will be understood that when an element is referred to as being "connected to" or "coupled to" or "electrically coupled to" another element, it can be directly connected or coupled, or intervening elements may be present.

The measurement system described herein may be implemented as any type of system that can benefit from use of the principles and concepts described herein, including, but not limited to, digital oscilloscopes, data acquisition systems (DAQs) and vector signal analyzers (VSAs).

FIG. 1 illustrates a block diagram of portions of a measurement system 100 having a data acquisition system 110 configured to perform a qualified store algorithm that stores a preselected, programmable amount of data before a qualification signal becomes valid and after the qualification signal becomes invalid. Storing this preselected, programmable amount of data ensures that the correct time span of data is available even after any data processing (e.g., filtering) that is performed during the data acquisition process. The measurement system 100 also includes a probe 120, a vertical system 130, a horizontal system 140, a display system 150, and a display device 160, a trigger system 170, and a control panel 180. The probe 120 is an input device that routes a signal from a device under test (DUT) 121 to the measurement system 100. The vertical system 130 controls the voltage scale on the display device 160. The horizontal system 140 controls the time scale on the display device 160. The display system 150 controls the display of information on the display device 160. The trigger system 170 detects trigger events and informs the data acquisition system 110 when a trigger event is detected. The trigger system 170 also stabilizes and focuses the measurement system 100 so that the waveform being displayed on the display device 160 appears static and unflinching. The control panel 180 is an input device that allows a user to control certain features of the measurement system 100 by making selections that are interpreted by a processor 200 of the data acquisition system 110 as commands that cause the processor 200 to perform various tasks.

The processor 200 may be any suitable computational device, including, for example, a microprocessor, a microcontroller, a digital signal processor (DSP), an application specific integrated circuit (ASIC) or other similar device that is capable of being programmed or configured to carry out the tasks associated with performing the qualified store algorithm. The term "processor" means at least one processor, and therefore could include multiple processors or processing cores. The processor may, for example, be a multi-core processor. A processor may also refer to a collection of processors within a single computer system or distributed amongst multiple computer systems.

In accordance with an illustrative embodiment, the processor 200 is configured as a finite state machine (FSM) to perform the qualified store algorithm. The processor 200 may perform tasks in addition to performing the qualified store algorithm. The operations of the processor 200, in accordance with an illustrative embodiment, will be described herein with reference to an exemplary state diagram. In accordance with this illustrative embodiment, the data acquisition system 110 also includes an analog-to-digital converter (ADC) 111, a memory controller 113 and a memory device 114. The processor 200, by controlling the memory controller 113, causes the qualified store algorithm to be performed. The memory controller 113 writes and reads the memory device 114.

In order to cause the measurement system 100 to perform the qualified store algorithm, the user makes a selection via the control panel 180 to cause the measurement system 100 to perform the qualified store algorithm. The input from the control panel 180 instructs the processor 200 to perform the qualified store algorithm. When performing the algorithm, the processor 200 takes actions based on whether or not a qualification signal is valid, and based on the state that the FSM is in when the qualification signal becomes valid or invalid. For purposes of discussion, it will be assumed that when the qualification signal is a binary 1, it is valid, and when it is a binary 0, it is invalid. The qualification signal, as that term is used herein, is a signal that is provided, or caused to be provided, by the user. There are many possible sources for the qualification signal. Measurement systems such as digital oscilloscopes typically have two to four channels, any of which may be used to provide the qualification signal to the measurement system 100. In addition, measurement systems often have logic timing channels that may be used for this purpose. Also, measurement systems typically have an external trigger input that may be used for this purpose. As another example, the qualification signal could be, for example, the power level in a frequency band on one of these channels. Also, these various sources that may be used individually as the qualification signal may be logically combined to provide the qualification signal. For example, the qualification signal may be valid when the power level in the frequency band is greater than some threshold value and an external input is asserted. An illustrative example of the manner in which the state of the qualification signal affects the data acquisition process will now be described with reference to FIG. 2.

Figure 2:
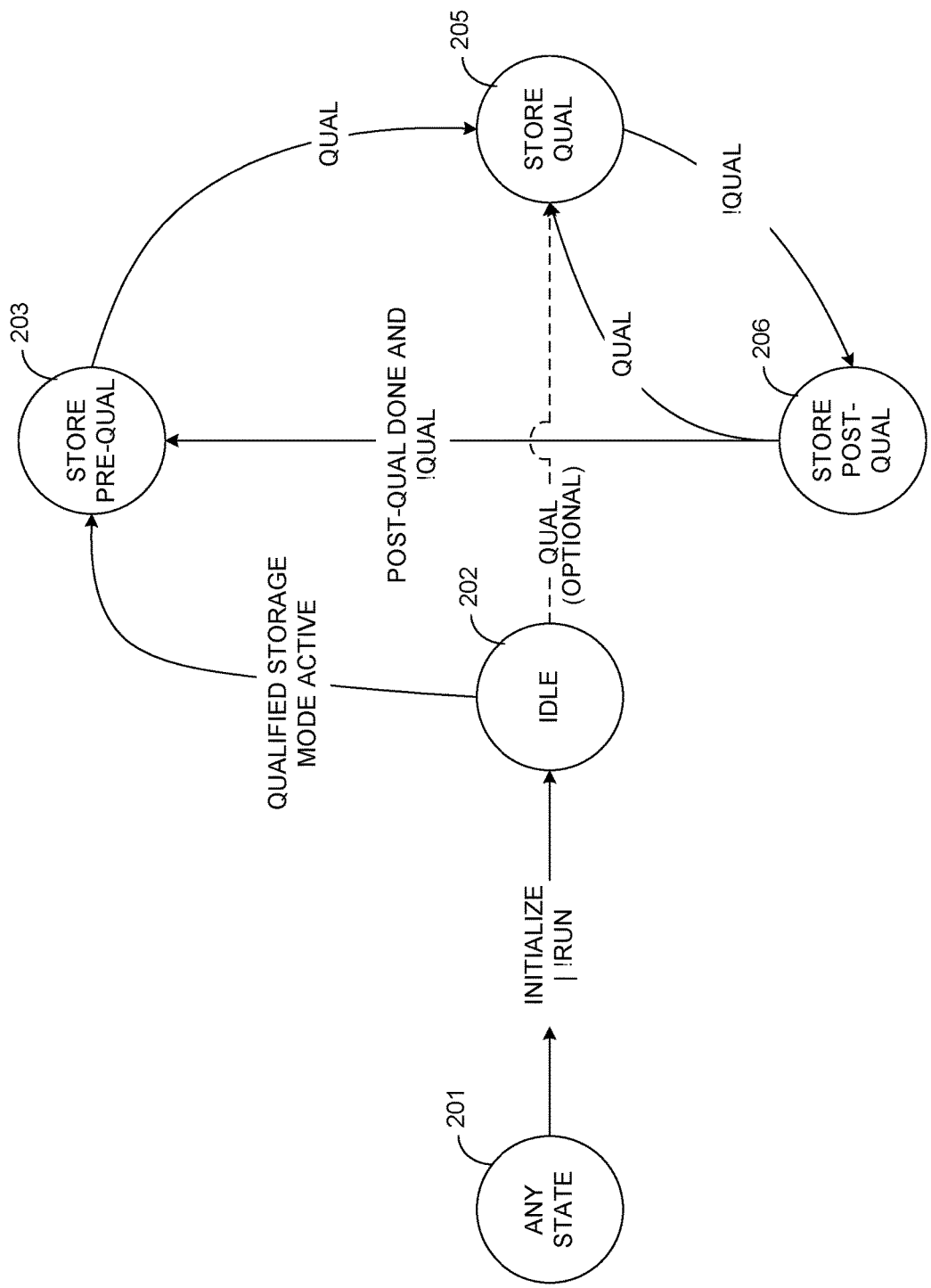
FIG. 2 illustrates a state diagram that represents the qualified store algorithm performed by the measurement system shown in FIG. 1 in accordance with an illustrative embodiment.

FIG. 2 illustrates a state diagram that represents the qualified store algorithm in accordance with an illustrative embodiment. The FSM running on the processor 200 controls the memory controller 113 to cause it to write digital data samples to the memory device 114 in accordance with the qualified store algorithm. When the measurement system 100 is in any state 201 and is placed in the qualified storage mode, the FSM enters the idle state 202. From the idle state 202, the FSM automatically enters a pre-qualification storage state ("Store Pre-Qual") 203. In the Store Pre-Qual state 203, data that is acquired is stored in a first portion of the memory device 114 that is configured to operate as a circular buffer. The circular buffer is N digital data samples deep. In accordance with this illustrative embodiment, N is a positive integer that is greater than or equal to one. As will be described below with reference to another embodiment, in some implementations of the measurement system 100, N can be a negative integer. In other words, the circular buffer has N digital data sample storage location such that it is capable of storing N digital data samples. In accordance with an illustrative embodiment, the value of N is programmable and is preselected by the user prior to performing the qualified store algorithm. In accordance with an embodiment, the user is able to set the value of N through interaction with the control panel 180.

While the FSM is in the Store Pre-Qual state 203, the circular buffer is continuously written and rewritten with N digital data samples. The samples are overwritten in an order from the oldest to the newest samples. If the qualification signal becomes valid ("Qual") while the FSM is in the Store Pre-Qual state 203, the FSM exits the Store Pre-Qual state 203 and enters the qualification storage ("Store Qual") state 205. For illustrative purposes, it will be assumed that at the instant in time when Qual becomes valid, the oscilloscope has been in the Store Pre-Qual state 203 long enough for N digital data samples to have been written to the circular buffer. Because this may not always be the case, a modification to the qualified store algorithm that allows it to handle the case where N digital data samples have not yet been written to the circular buffer at the time that Qual becomes valid is discussed below. For now, it will be assumed that N digital data samples are stored in the circular buffer at the instant in time that Qual becomes valid.

In the Store Qual state 205, as digital data samples are acquired, they are written linearly into locations in a second portion of the memory device 114. If the Qual signal becomes invalid ("!Qual") while the FSM is in the Store Qual state 205, the FSM exits the Store Qual state 205 and enters the post-qualification storage ("Store Post-Qual") state 206. In the Store Post-Qual state 206, M digital data samples are written linearly into a third portion of the memory device 114 as the data samples are acquired. In accordance with this illustrative embodiment, M is a positive integer that is greater than or equal to one. As will be described below with reference to another embodiment, in some implementations of the measurement system 100, M can be a negative integer.

The second and third portions of the memory device 114 are typically contiguous portions of memory device 114, i.e., the first storage location in the third portion follows immediately after the last storage location in the second portion. The first and second portions of the memory device 114 may also be contiguous portions of memory device 114 such that the first storage location in the second portion follows immediately after the last storage location in the first portion. Using contiguous memory locations in this manner is not a requirement of the embodiments described herein, but provides efficiency in writing the samples to memory and reading the samples out of memory, particularly for the second and third portions in which the samples are written linearly to memory. In some cases, it may be advantageous for the circular buffer to be located in a memory device that is separate from the memory device that is used for storing the Store Qual samples and the Store Post-Qual samples in the Store Qual and Store Post-Qual states 205 and 206, respectively.

It can be seen from the above discussion of FIG. 2 that once the M digital data samples have been written to the third portion of the memory device 114 in the Store Post-Qual state, the memory device 114 contains N samples of pre-qualification data (i.e., the N samples stored in the circular buffer just before Qual became valid), a number of samples of qualification data (i.e., samples stored during the time window between the instant in time when Qual became valid and the instant in time when Qual became invalid), and M samples of post-qualification data. In order to reconstruct the portion of the acquired waveform represented by the pre-qualification samples, the qualification samples and the post-qualification samples, the processor 200 instructs the memory controller 113 to read the samples out of memory device 114 and send them to the digital display system 150. The digital display system 150 causes the reconstructed waveform to be displayed on the display device 160.

With reference again to the Store Post-Qual state 206, once the M digital data samples have been stored in memory, the FSM exits the Store Post-Qual state 206 and re-enters the Store Pre-Qual state 203. When the FSM re-enters the Store Pre-Qual state 203, the FSM stores the next N digital data samples in a new circular buffer. The FSM remains in the Pre-Qual state 203 and continues to write digital data samples to the circular buffer until Qual becomes valid. When Qual becomes valid, the process described above with reference to the Store Qual state 205 and the Store Post-Qual state 206 is repeated.

There are a few startup exceptions to the process described above with reference to the state diagram shown in FIG. 2. On startup, the circular buffer may not have N digital data samples stored in it at the instant in time that Qual becomes valid for the first time. In fact, Qual could become valid before the FSN enters the idle state 202. One way to handle this startup issue is indicated by an optional branch in the state diagram shown in FIG. 2 showing the FSN exiting the idle state 202 and entering the Store Qual state 205. If Qual becomes valid while the FSM is in the Store Pre-Qual state 203, but before N samples have been written to the circular buffer, the FSM exits the Store Pre-Qual state 203 and enters the Store Qual state 205. In the latter case, as many of the Store Pre-Qual samples as have been stored in the circular buffer at the instant in time when Qual becomes valid will be available. Another way to handle the startup issue would be to ignore the first time Qual becomes valid after startup, which should ensure that the circular buffer has some number of samples in it when Qual becomes valid the second time and thereafter.

There are also a few exceptions to the process described above with reference to the state diagram shown in FIG. 2 after the Store Post-Qual state 206 has been entered. One exception occurs when the FSM is in the Store Post-Qual state 206 and Qual becomes valid before M samples have been written to the third portion of memory device 114. If this happens, the FSM exits the Store Post-Qual state 206 and re-enters the Store Qual state 205, as indicated by the arrow from the Store Post-Qual state 206 to the Store Qual state 205. The Store Qual samples are then stored in memory as though Qual had not become invalid while the FSM was previously in the Store Qual state 205. Because the memory device 114 is written linearly in the Store Qual state 205 and in the Store Post-Qual state 206, the data that is written to the memory device 114 will be the same regardless of whether it is written in the Store Qual state 205 or in the Store Post-Qual state 206. Although in the Store Post-Qual state the samples are being written to what is referred to herein as the third portion of memory, the storage locations in this third portion of memory become part of the second portion of memory when the process returns to the Store Qual state 205 from the Store Post-Qual state 206. In other words, the second portion of memory becomes larger and the third portion of memory will start at a different address than it started at when the FSM previously entered the Store Post-Qual state 206 after exiting the Store Qual state 205.

Another exception occurs when the FSM enters the Store Pre-Qual state 203 after the Store Post-Qual state 206 has been entered the first time and Qual becomes valid before N+1 samples have been written to the circular buffer, i.e., before the circular nature of the circular buffer has been used. If this happens, the FSM exits the Store Pre-Qual state 203 and re-enters the Store Qual state 205. The Store Qual samples are then stored in the second memory portion as though Qual had not become invalid while the FSM was previously in the Store Qual state 205. In both of these exceptions that occur after the Store Post-Qual state 206 has been entered, the N Pre-Qual samples and the M Post-Qual samples are automatically available.

Many modifications may be made to the process represented by the state diagram shown in FIG. 2. One such modification is making log entries when certain events occur. Log entries can enhance the usefulness of the qualified store algorithm to the user. For example, a log entry should be made either when Qual goes from invalid to valid, except for the first time after startup, or when Qual goes from valid to invalid. This informs the user and the processor 200 of where each qualified record begins and ends. Additional log entries may be useful in some applications, such as, for example, when exiting the Store Post-Qual state 206 and entering the Store Qual state 205 before M samples have been stored in the circular buffer.

As indicated above, known qualified store algorithms are useful for capturing data when the lengths in time of the events of interest in the waveform being measured change, such as radar pulses that are longer in time when the target is a greater distance away from the radar system and shorter in time when the target is a smaller distance away from the radar system. A typical triggered acquisition would not be efficient in terms of acquisition memory usage in such applications because the user must set a time window relative to the trigger event that is large enough to capture the pulses that are longer in time, which, as described above, wastes acquisition memory. On the other hand, if the time window is set too small, less memory is used, but the pulses that are longer in time will not be captured in their entirety. As described above, known qualified store algorithms allow the user to provide a signal that sets the time window and allows the user to adjust the time window as needed. Therefore, the time window can be adjusted by the user based on the length of the pulses so that memory is not wasted. As indicated above, however, known qualified store algorithms do not capture data prior to the qualification signal becoming valid or after the qualification becomes invalid. Therefore, the data on either side of the time window is not available when using the known qualified store algorithm.

Figure 3:
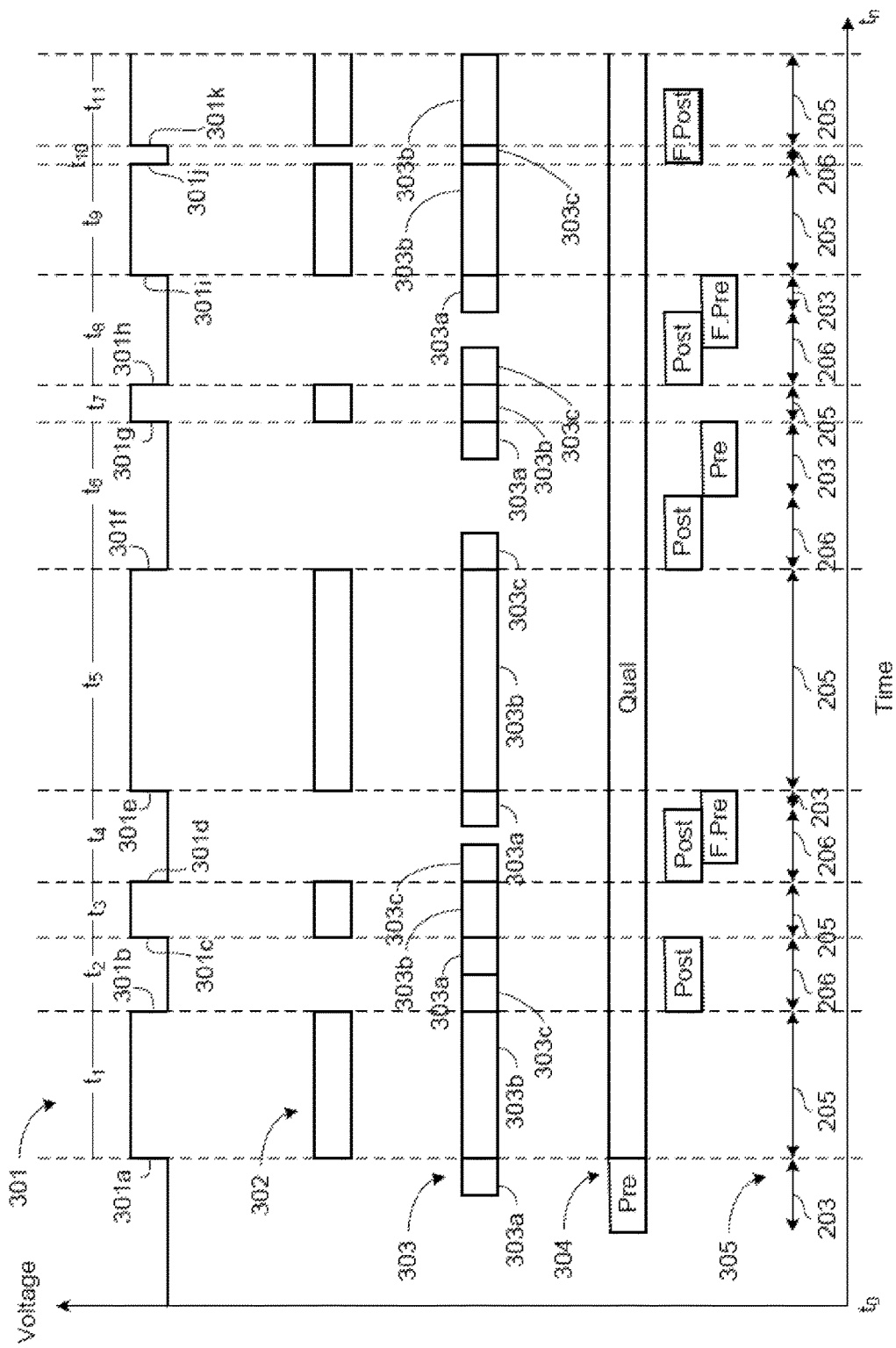
FIG. 3 illustrates a timing diagram of a qualification signal, data stored in memory by the known qualified store algorithm, data stored in memory by the qualified store algorithm of the illustrative embodiment for first values of N and M, and data stored in memory by the qualified store algorithm of the illustrative embodiment for second values of N and M.

FIG. 3 illustrates a timing diagram of a qualification signal 301, data 302 stored in memory by the known qualified store algorithm, data 303 stored in memory by the qualified store algorithm of the illustrative embodiment for first values of N and M, data 304 stored in memory by the qualified store algorithm of the illustrative embodiment for second values of N and M, and a time line 305 indicating which of the states shown in FIG. 2 the FSM is in relative to the qualification signal 301 and the data 304. For the data 303 and 304, N=M for purposes of discussion, but N and M do not have to have the same values. A comparison of the qualification signal 301 with the stored data 302 shows that the known qualified store algorithm only captures and stores data when the qualification signal is valid, i.e., no pre- or post-qualification signal data is stored. In contrast, a comparison of the qualification signal 301 with the stored data 303 shows that the qualified store algorithm of the illustrative embodiment captures and stores data 303a prior to the qualification signal 301 becoming valid, captures and stores data 303b during the time period when the qualification signal remains valid, and captures and stores data 303c after the qualification signal becomes invalid. As indicated above with reference to FIG. 2 the amount of pre- and post-qualification data 301a and 301c, respectively, that is stored is preselected by the user, e.g., by setting the values of N and M, respectively, prior to performing the qualified store algorithm.

Data 304 demonstrates the manner in which data is stored when one or more of the aforementioned exceptions occur. Prior to the transition 301a of Qual from the invalid state to the valid state, N samples of pre-qualification data have been stored in the circular buffer. While Qual is in the valid state during time window $t_1$, the FSM is in the Store Qual state 205 and digital data samples are being linearly written to memory. The time line 305 is labelled with the same reference numerals that are used to designate the states in the timing diagram shown in FIG. 2. When Qual transitions from the valid state to the invalid state at transition 301b, the FSM exits the Store Qual state 205 and enters the Store Post-Qual state 206 in which M digital data samples of data are linearly written to memory, as indicated by the block labeled "Post." The FSM then exits the Store Post-Qual state 206 and re-enters the Store Pre-Qual state 203. However, because Qual becomes valid again at transition 301c as the $M^{th}$ Post-Store sample is stored, the FSM re-enters the Store Qual state 205 at the end of time window $t_2$. This corresponds to one of the exceptions described above with reference to FIG. 2.

During time window $t_3$, while the FSM is in the Store Qual state 205, digital data samples are captured and written linearly to memory. When Qual transitions from the valid state to the invalid state at transition 301d, the FSM exits the Store Qual state 205 and re-enters the Store Post-Qual state 206. During time window $t_4$, while the FSM is in the Store Post-Qual state 206, M digital data samples are linearly written to memory, as indicated by the block labelled "Post" in time window $t_4$, and then the FSM exits the Store Post-Qual state 206 and re-enters the Store Pre-Qual state 203. However, there is insufficient time in time window $t_4$ for N digital data samples to be stored in the circular buffer before Qual transitions from invalid to valid at transition 301e, and therefore results in a failed Pre-Qual ("F. Pre") store, as indicated by the block labeled "F. Pre" in time window $t_4$. At transition 301e, the FSM exits the Store Pre-Qual state 203 and re-enters the Store Qual state 205, in which digital data samples are captured and linearly written to memory during time window $t_5$. When Qual transitions from the valid state to the invalid state at transition 301f, the FSM exits the Store Qual state 205 and re-enters the Store Post-Qual state 206. During time window $t_6$ while the FSM is in the Store Post-Qual state 206, there is sufficient time for M digital data samples to be linearly written to memory, as indicated by the block labeled "Post." After writing M samples to memory, the FSM exits the Store Post-Qual process 206 and re-enters the Store Pre-Qual state 203. While in this state, there is sufficient time in time window $t_6$ for N digital data samples to be written to the circular buffer before Qual transitions from the invalid state to the valid state at transition 301g, as indicated by the block labeled "Pre" to indicate a successful pre-qualification store.

When Qual transitions from the invalid state to the valid state at transition 301g, the FSM exits the Store Pre-Qual state 203 and re-enters the Store Qual state 205. While in this state during time window $t_7$, digital data samples are captured and linearly written to memory. When Qual transitions from the valid state to the invalid state at transition 301h, the FSM exits the Store Qual state 205 and re-enters the Store Post-Qual state 206. During time window $t_8$ while the FSM is in the Store Post-Qual state 206, there is sufficient time for M digital data samples to be linearly written to memory, as indicated by the block labeled "Post." After writing M samples to memory, the FSM exits the Store Post-Qual process 206 and re-enters the Store Pre-Qual state 203. However, there is insufficient time in time window $t_8$ for N digital data samples to be stored in the circular buffer before Qual transitions from invalid to valid at transition 301i, as indicated by the block labeled "F. Pre" in time window $t_8$.

At transition 301i, the FSM exits the Store Pre-Qual state 203 and re-enters the Store Qual state 205, in which digital data samples are captured and linearly written to memory during time window $t_9$. At transition 301j, the FSM exits the Store-Qual state 205 and re-enters the Store Post-Qual state 206. However, time window $t_{10}$ is too short for M samples to be written to memory, and therefore there is a failed Post-Qual store attempt, as indicated by the block labelled "F.Post". Therefore, when Qual becomes valid again at transition 301k, the FSM exits the Store Post-Qual state 206 and re-enters the Store Qual state 205.

One of the advantages of the qualified store algorithm of the illustrative embodiment is that samples that would otherwise be lost due to signal processing are preserved during data acquisition. Another advantage is that the time window of acquired data can be fairly arbitrarily shifted in time with respect to the qualification signal by setting the values of N and M, thereby providing the user with more control over the data acquisition process. Yet another advantage is that there is no dead time between acquired segments. When using known triggering modes, there is often a minimum dead time between acquired segments during which the system calculates the trigger time and switches storage segments. With the qualified store algorithm of the illustrative embodiments, there is no dead time between acquired segments.

Figure 4:
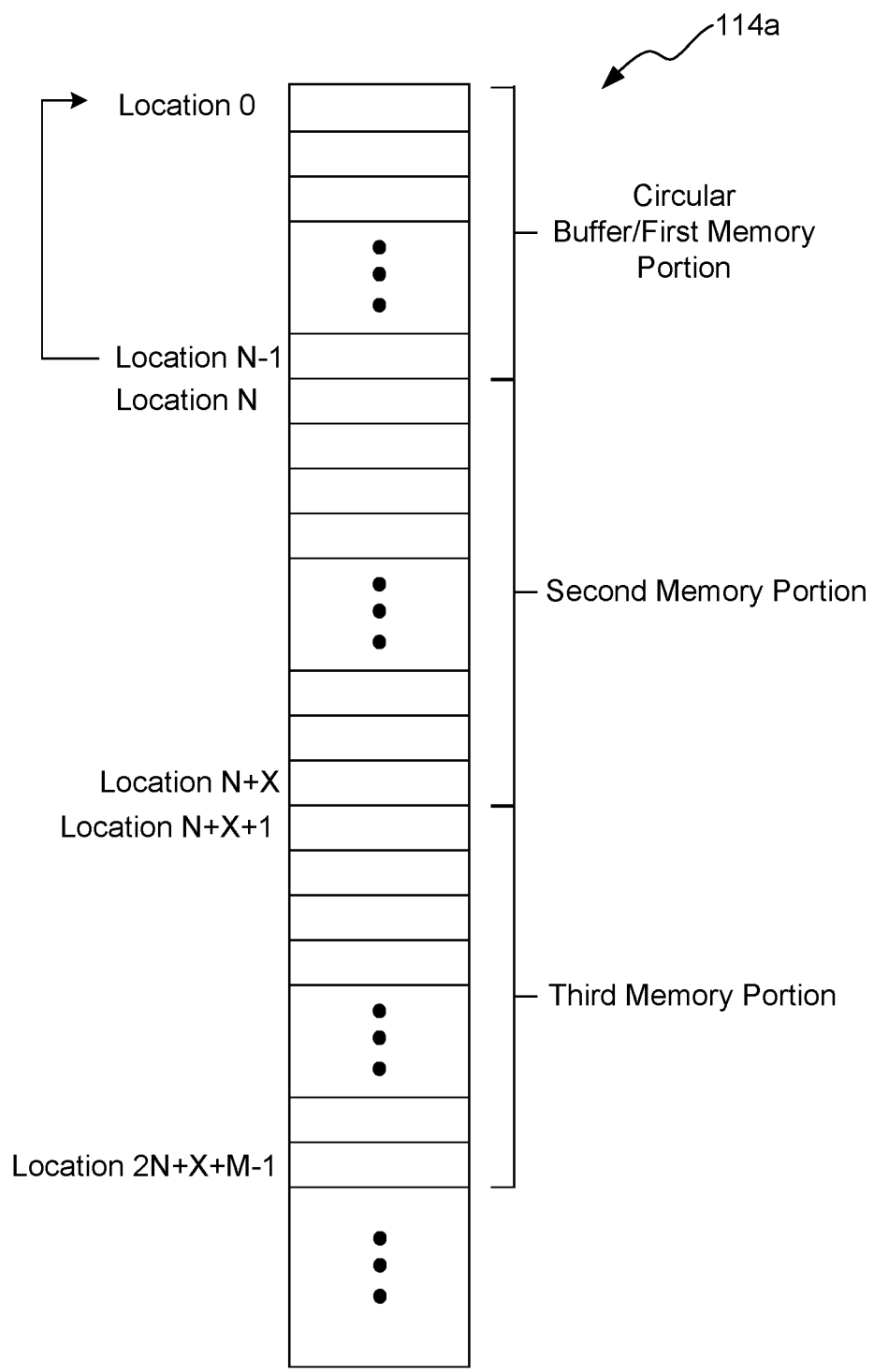
FIG. 4 illustrates a block diagram of a portion of the memory device shown in FIG. 1 in accordance with an illustrative embodiment having a first memory portion that operates as a circular buffer, and having second and third memory portions that comprise contiguous sample storage locations in the memory device.

FIG. 4 illustrates a block diagram of a portion 114a of the memory device 114 shown in FIG. 1 in accordance with an illustrative embodiment in which the circular buffer, which corresponds to the first portion of the memory device 114 used by the qualified store algorithm, and the second and third portions of the memory device 114 comprise contiguous sample storage locations in the memory device 114. As indicated above, the circular buffer may be in a memory device other than memory device 114. The second and third memory portions could be located in different memory devices, but because the qualified store algorithm described with reference to FIG. 2 writes them linearly, it is more efficient for them to be contiguous memory portions of the same memory device.

The circular buffer written in the Store Pre-Qual state 203 is made up of sample storage locations 0 through N−1. It should be noted that storage location 0 is not intended to denote the first addressable location in the memory device 114, but simply the first storage location in the portion of memory that is allocated as the circular buffer. The second memory portion written in the Store Qual state 205 is made up of sample storage locations N through N+X−1, where X is the number of samples that are written linearly to memory during the time window between the instant in time when Qual becomes valid and the instant in time when Qual becomes invalid. The third memory portion written in the Store Post-Qual state 206 is made up of sample storage locations N+X through N+X+M−1. As indicated above, N and M are preselected values, and in some embodiments may be set by the user through interaction the control panel 180. It is not necessary in all embodiments for the values of N and M to be capable of being set by the user. In some embodiments, they may be factory settings that are programmed into or configured in the processor 200 in software, firmware and/or hardware.

While the FSM is in the Store Pre-Qual state 203, N acquired digital data samples are written to locations 0 through N−1, respectively. As soon as the $(N-1)^{th}$ sample has been written to the location N−1, the process starts over and the next N acquired digital data samples are written to locations 0 through N−1, respectively, overwriting the previously written N digital samples. It should be noted that on the final time through the process of writing samples to the circular buffer, any number of samples ranging from 1 through N may be written to the circular buffer. This process of writing and overwriting locations in the circular buffer repeats until Qual becomes valid. An option is to log the total number of entries that are written into the circular buffer, even if they are overwritten, so that the processor 200 keeps track of precisely how many samples were overwritten, and therefore will know the time relationship between the previous qualified record and the current qualified record. Knowing this information allows the processor 200 to know the time relationship between all stored samples.

When Qual becomes valid, the FSM exists the Store Pre-Qual state 203 and enters the Store Qual state 205, in which the FSM begins linearly writing X acquired digital data samples to locations N through Location N+X−1. The value of X is not preselected, but is the number of digital data samples that are acquired from the instant time when Qual becomes valid to the instant time when Qual becomes invalid. Once Qual becomes invalid, the FSM enters the Store Post-Qual state 206 and begins linearly writing M acquired digital data samples to location N+X through location N+X+M−1, respectively. Once the M digital data samples have been written, the FSM re-enters the Store Pre-Qual state 203 and begins writing the next circular buffer. For example, the next circular buffer may comprise the N storage locations ranging from storage location N+X+M to storage location 2N+X+M−1.

As indicated above with reference to FIG. 2, various exceptions to the process described above may be made to handle cases where Qual becomes valid before N samples have been stored in the circular buffer or where Qual becomes valid before M samples have been stored in the third memory portion. The occurrence of an exception can cause the number of sample storage locations that are in the second and third memory portions to change. For example, if the FSM is in the Store Post-Qual state 206 and Qual becomes valid before M samples have been written to the third memory portion, the process exits the Store Post-Qual state 206, re-enters the Store Qual state 205 and resumes writing samples linearly to the second memory portion as if Qual had not become invalid. This increases the number of storage locations that are considered part of the second memory portion results in storage locations that were previously considered as belonging to the third memory portion when they were written during the Store Post-Qual state 206 being overwritten during the Store Qual state. The overwritten locations are now considered part of the second memory portion because they hold qualification data written during the Store Qual state 205.

As also indicated above, various log entries may be entered into a log in memory at various times to provide the user with useful information. Additional information may also be stored in memory, such as a sample index of all samples since the start of data acquisition.

A variety of modifications may be made to the illustrative embodiments described above with reference to FIGS. 1-4. As indicated above, in some embodiments, N and M can take on negative values. An example of M having a negative value is as follows. There may be cases in which the user wants the qualification signal to be the power level in a frequency band. This may require that some signal processing be performed (e.g., filtering, fast Fourier transform (FFT), etc.) on the acquired digital data samples in order to produce the qualification signal. This signal processing leads to latency (L) that calls for increasing the value of N and decreasing the value of M in order to deal with the latency by adding L to N and subtracting L from M to generate new N and M values, N' and M', respectively: N'=N+L; M'=M−L. This can result in M' having a negative value. If $|M'| \leq N$, then the adjustment can be made easily when Qual changes from the valid state to the invalid state by skipping the Store Post-Qual state 206 after exiting the Store Qual state 205 and re-entering the Store Pre-Qual state 203. In this case, the adjustment is made by having the circular buffer begin at a storage location corresponding to the current storage location address plus M'. For the next circular buffer, the beginning storage location will be N'+X+M' (M' is negative), and the ending storage location of the circular buffer will be 2N'+X+M'−1.

There may be cases in which it is desirable to wait for a latency period L after Qual becomes valid before writing acquired digital data samples to memory. In such cases, the Store Pre-Qual state 203 is simply a waiting state. In these cases, L has a negative value that results in N' having a negative value. The FSM waits in the Store Pre-Qual state 203 for N' sample periods after Qual becomes valid before exiting the Store Pre-Qual state 203 and entering the Store Qual state 205. When the FSM enters the Qual state, it begins writing acquired digital data samples to memory.

There are other ways to accomplish the objective of delaying for a latency period after Qual becomes valid before writing digital data samples to memory. For example, rather than waiting in the Store Pre-Qual state 203 for a time period equal to N' sample periods, the FSM could exit the Store Pre-Qual state when Qual changes from the invalid state to the valid state, but then delay for N' sample periods in the Store Qual state before writing digital data samples to memory.

An example of how digital data samples might be stored in the memory device 114 for a negative value of M, where $|M| \leq N$ will now be described with reference to FIG. 4. Qual becomes invalid just after address N+X−1 has been written. When Qual becomes invalid, the last part of the data being written to the second memory portion transitions to pre-Qual data because the FSM has re-entered the Store Pre-Qual state 203 after exiting the Store Qual state 205. Storage location at address N+X−1 now becomes part of the next circular buffer and the pre-Qual data stored in it may be overwritten. It should be noted that if X is small enough, the next circular buffer starting at address N+X−1 may be contiguous with the previous circular buffer, which is perfectly fine. The pre-Qual data that the user needs is still retained, and as long as the aforementioned log entries are maintained, the location of the pre-Qual data in the memory device 114 can easily be determined by the processor 200.

As indicated above, the qualified store algorithm described above with reference to FIGS. 1-4 is performed or caused to be performed by the processor 200. In order to carry out the tasks associated with the qualified store algorithm, the processor 200 is configured to execute computer instructions, or code, in the form of software and/or firmware. These instructions are stored in one or more memory devices that are internal (e.g., memory device 114) to or external (not shown) to the measurement system 100. Such memory devices constitute non-transient computer-readable mediums. A variety of non-transient computer-readable mediums are suitable for use with the invention, including, for example, solid state storage devices, magnetic storage devices and optical storage devices.

It should be noted that the invention has been described with reference to illustrative, or representative, embodiments and that the invention is not limited to the disclosed embodiments. Many variations may be made to the disclosed embodiments without deviating from the scope of the invention, as will be understood by those of skill in the art in view of the description provided herein, the drawings, and the appended claims.

What is claimed is:

1. A measurement system comprising:
an analog-to-digital converter (ADC) configured to sample a time-varying waveform to create an acquisition record made up of acquired digital data samples;
memory; and
a processor configured to perform a qualified store algorithm when the measurement system is in a qualified storage mode of operations, wherein when the processor performs the qualified store algorithm, the processor stores in memory digital data samples acquired during a time window while a qualification signal is valid, a preselected number of digital data samples acquired prior to and adjacent in time to the time window, and a preselected number of digital data samples acquired subsequent to and adjacent in time to the time window.

2. A measurement system that ensures that a preselected number of digital data samples are stored before and after a qualification signal becomes valid when the measurement system is performing a qualified store algorithm, the measurement system comprising:
an analog-to-digital converter (ADC) configured to sample a time-varying waveform to create an acquisition record made up of acquired digital data samples;
memory; and
a processor configured to perform the qualified store algorithm when the measurement system is in a qualified storage mode of operations, wherein when the processor performs the qualified store algorithm, the processor causes N digital data samples acquired before the qualification signal became valid to be stored in a first portion of memory, causes X digital data samples acquired during a time window that starts when the qualification signal becomes valid and ends when the qualification signal becomes invalid to be stored in a second portion of memory, and causes M digital data samples acquired after the qualification signal becomes invalid to be stored in a third portion of memory, where N, X and M are integers.

3. The measurement system of claim 2, wherein the ADC, the memory and the processor are parts of a data acquisition system of the measurement system.

4. The measurement system of claim 3, wherein the first portion of memory is configured to operate as a circular buffer having N sample locations for storing the N digital data samples, respectively.

5. The measurement system of claim 4, wherein the first, second and third portions of memory are respective portions of a single memory device.

6. The measurement system of claim 4, wherein the second and third portions of memory are respective portions of a single, first memory device and wherein the first portion of memory that operates as a circular buffer is part of a second memory device that is separate from the first memory device.

7. The measurement system of claim 4, wherein the processor is configured as a finite state machine (FSM) having at least a pre-qualification storage (Store Pre-Qual) state, a qualification storage (Store Qual) state and a post-qualification storage (Store Post-Qual) state, wherein when the FSM is in the Store Pre-Qual state, the processor causes the N digital data samples acquired before the qualification signal became valid to be stored in the first portion of memory, and wherein when the FSM is in the Store Pre-Qual state and the qualification signal becomes valid, the FSM exits the Store Pre-Qual state and enters the Store Qual state, and wherein when the FSM is in the Store Qual state, the processor causes the X digital data samples to be stored in the second portion of memory, and wherein when the FSM is in the Store Qual state and the qualification signal becomes invalid, the FSM exits the Store Qual state and enters the Store Post-Qual state, and wherein when the FSM is in the Store Post-Qual state, the processor causes the M digital data samples to be stored in the third portion of memory.

8. The measurement system of claim 7, wherein if the FSM is in the Store Post-Qual state and the M digital data samples have been stored in the third portion of memory, the FSM exits the Store Post-Qual state and re-enters the Store Pre-Qual state, and wherein when the FSM re-enters the Store Pre-Qual state, the processor causes N newly-acquired digital data samples to be stored in the first portion of memory.

9. The measurement system of claim 8, wherein once the FSM has re-entered the Store Pre-Qual state and N newly-acquired digital data samples have been stored in the first portion of memory, if the qualification signal becomes valid, the FSM re-enters the Store Qual state and X newly-acquired digital data samples are stored in the second portion of the memory.

10. The measurement system of claim 9, wherein once the FSM has re-entered the Store Qual state and X newly-acquired digital data samples have been stored in the second portion of memory, if the qualification signal becomes invalid, the FSM re-enters the Store Post-Qual state and M newly-acquired digital data samples are stored in the third portion of the memory.

11. The measurement system of claim 7, wherein if the FSM is in the Store Post-Qual state and the qualification signal becomes valid before all of the M digital data samples have been stored in the third portion of memory, the FSM exits the Store Post-Qual state and re-enters the Store Qual state, and wherein when the FSM re-enters the Store Qual state, the processor causes X digital data samples to be stored in the second portion of memory.

12. The measurement system of claim 11, wherein if the FSM is in the Store Post-Qual state and the qualification signal becomes valid before all of the M digital data samples have been stored in the third portion of memory, the FSM causes a log entry to be stored in a log in memory.

13. The measurement system of claim 8, wherein if the FSM has re-entered the Store Pre-Qual state after exiting the Store Post-Qual state and the qualification signal becomes valid before the N newly-acquired digital data samples have been stored in the first portion of memory, the FSM exits the Store Pre-Qual state and re-enters the Store Qual state, and wherein when the FSM re-enters the Store Qual state, the processor causes X digital data samples to be stored in the second portion of memory.

14. The measurement system of claim 13, wherein if the FSM has re-entered the Store Pre-Qual state after exiting the Store Post-Qual state and the qualification signal becomes valid before the N newly-acquired digital data samples have been stored in the first portion of memory, the FSM causes a log entry to be stored in a log in memory.

15. The measurement system of claim 14, wherein if the FSM has re-entered the Store Pre-Qual state after exiting the Store Post-Qual state and the qualification signal becomes valid before the N newly-acquired digital data samples have been stored in the first portion of memory, the FSM causes a sample index of all digital data samples since the start of data acquisition to be stored in memory.

16. The measurement system of claim 13, wherein if the FSM has re-entered the Store Pre-Qual state after exiting the Store Post-Qual state and the qualification signal becomes valid before the N newly-acquired digital data samples have been stored in the first portion of memory, the FSM causes a log entry to be stored in a log in memory.

17. The measurement system of claim 2, wherein each time the qualification signal changes from invalid to valid after a first time that the qualification signal changes from invalid to valid, a finite state machine (FSM) causes a log entry to be stored in a log in memory.

18. The measurement system of claim 17, wherein each time the qualification signal changes from valid to invalid, the FSM causes a log entry to be stored in a log in memory.

19. The measurement system of claim 2, wherein where N and M are preselected values.

20. The measurement system of claim 19, wherein the qualification signal is a signal that a user of the measurement system causes to be provided to the measurement system.

21. A qualified store method for use in a measurement system that ensures that a preselected number of digital data samples are stored before and after a qualification signal becomes valid, the method comprising:
sampling a time-varying waveform to create an acquisition record made up of acquired digital data samples;
in a finite state machine (FSM), monitoring a state of a qualification signal to determine when the state of the qualification signal changes from an invalid state to a valid state and from the valid state to the invalid state; and
in the FSM, entering a pre-qualification store (Store Pre-Qual) state in which acquired digital data samples are written to a first portion of memory that acts as a circular buffer, the circular buffer having N storage locations for storing N respective acquired digital data samples, where N is an integer, wherein when the FSM is in the Store Pre-Qual state and the state of the qualification signal changes from the invalid state to the valid state, the FSM exits the Store Pre-Qual state and enters a qualification store (Store Qual) state in which acquired digital data samples are written to a second portion of memory, and wherein when the FSM is in the Store Qual state and the state of the qualification signal changes from the valid state to the invalid state, the FSM exits the Store Qual state and enters a post-qualification store (Store Post-Qual) state in which acquired digital data samples are written to a third portion of memory, the third portion of memory having M digital data sample storage locations, where M is an integer.

22. The qualified store method of claim 21, wherein when the FSM is in the Store Post-Qual state and M digital data samples have been stored in the third portion of memory, the FSM exits the Store Post-Qual state and re-enters the Store Pre-Qual state in which acquired digital data samples are written to the circular buffer.

23. A non-transitory computer-readable medium having computer code stored thereon for execution by at least one processor, the computer code comprising:
- a first code segment that monitors a state of a qualification signal to determine when the state of the qualification signal changes from an invalid state to a valid state and from the valid state to the invalid state;
- a second code segment that causes acquired digital data samples to be written to a first portion of memory while the qualification signal is in the invalid state, the first portion of memory acting as a circular buffer, the circular buffer having N storage locations for storing N respective acquired digital data samples, where N is an integer;
- a third code segment that causes acquired digital data samples to be written to a second portion of memory when the qualification signal changes from the invalid state to the valid state and to continue writing acquired digital data samples to the second portion of memory until the qualification signal changes from the valid state to the invalid state; and
- a fourth code segment that causes acquired digital data samples to be written to a third portion of memory when the qualification signal changes from the valid state to the invalid state and to continue writing acquired digital data samples to the third portion of memory until either M acquired digital data samples have been written to the third portion of memory or the qualification signal changes from the invalid state to the valid state, where M is an integer.

24. The non-transitory computer-readable medium of claim 23, wherein if the fourth code segment completes writing the M acquired digital data samples to the third portion of memory and the qualification signal has not changed from the invalid state to the valid state, the second code segment causes acquired digital data samples to be written to the circular buffer.

25. The non-transitory computer-readable medium of claim 24, wherein if the fourth code segment does not complete writing the M acquired digital data samples to the third portion of memory before the qualification signal changes from the invalid state to the valid state, the third code segment causes acquired digital data samples to be written to the second portion of memory.

* * * * *